(12) United States Patent
Tan et al.

(10) Patent No.: US 8,129,222 B2
(45) Date of Patent: Mar. 6, 2012

(54) HIGH DENSITY CHIP SCALE LEADFRAME PACKAGE AND METHOD OF MANUFACTURING THE PACKAGE

(75) Inventors: Hien Boon Tan, Singapore (SG); Anthony Yi Sheng Sun, Singapore (SG)

(73) Assignee: United Test and Assembly Test Center Ltd., Singapore (SG)

( * ) Notice: Subject to any disclaimer, the term of this patent is extended or adjusted under 35 U.S.C. 154(b) by 1856 days.

(21) Appl. No.: 10/721,382

(22) Filed: Nov. 26, 2003

(65) Prior Publication Data

US 2004/0104457 A1    Jun. 3, 2004

Related U.S. Application Data

(60) Provisional application No. 60/429,315, filed on Nov. 27, 2002.

(51) Int. Cl.
*H01L 21/00* (2006.01)
(52) U.S. Cl. .................... 438/118; 438/123; 438/124
(58) Field of Classification Search .................. None
See application file for complete search history.

(56) References Cited

U.S. PATENT DOCUMENTS

| | | | | |
|---|---|---|---|---|
| 4,937,656 A | * | 6/1990 | Kohara | 257/676 |
| 4,943,843 A | * | 7/1990 | Okinaga et al. | 257/666 |
| 5,234,866 A | * | 8/1993 | Okinaga et al. | 29/827 |
| 5,363,279 A | | 11/1994 | Cha | |
| 5,428,248 A | | 6/1995 | Cha | |
| 5,477,079 A | * | 12/1995 | Hiruta | 257/665 |
| 5,495,398 A | * | 2/1996 | Takiar et al. | 361/790 |
| 5,519,251 A | | 5/1996 | Sato et al. | |
| 5,541,446 A | * | 7/1996 | Kierse | 257/666 |
| 5,663,594 A | * | 9/1997 | Kimura | 257/666 |
| 5,770,888 A | | 6/1998 | Song et al. | |
| 5,780,925 A | * | 7/1998 | Cipolla et al. | 257/676 |
| 5,789,280 A | | 8/1998 | Yokota | |
| 5,894,108 A | | 4/1999 | Mostafazadeh et al. | |
| 5,907,769 A | * | 5/1999 | Corisis | 438/123 |
| 5,977,615 A | * | 11/1999 | Yamaguchi et al. | 257/666 |
| 6,130,115 A | * | 10/2000 | Okumura et al. | 438/124 |
| 6,130,474 A | * | 10/2000 | Corisis | 257/676 |
| 6,166,430 A | | 12/2000 | Yamaguchi | |

(Continued)

OTHER PUBLICATIONS

*Internet Article*: Jim Lipman, "NEW IC Packages really pack in the leads" *EDN Access*, Sep. 1, 1997.

(Continued)

*Primary Examiner* — David Graybill
(74) *Attorney, Agent, or Firm* — Sughrue Mion, PLLC

(57) ABSTRACT

An integrated circuit package having a die pad with a first face and a second face, a plurality of inner leads, and a plurality of sides between the first face and the second face. The plurality of inner leads is disposed substantially co-planer with and substantially around the die pad. The package also comprises a plurality of outer leads disposed substantially co-planar with and substantially around the plurality of inner leads and the die pad, so that the sides of each of the plurality of outer leads are offset from the sides of each of the plurality of inner leads. A first adhesive layer disposed on the first face of the die pad and a second adhesive layer disposed on the first faces of each of the plurality of inner leads. An IC chip is coupled to the first face of the die pad through the first adhesive layer and to the plurality of inner leads through the second adhesive layer. The package further comprises wires linking the inner leads and outer leads to the IC chip.

2 Claims, 8 Drawing Sheets

U.S. PATENT DOCUMENTS

| | | | |
|---|---|---|---|
| 6,177,718 B1 | 1/2001 | Kozono | |
| 6,198,171 B1* | 3/2001 | Huang et al. | 257/787 |
| 6,225,146 B1* | 5/2001 | Yamaguchi et al. | 438/123 |
| 6,229,200 B1* | 5/2001 | Mclellan et al. | 257/666 |
| 6,242,281 B1* | 6/2001 | Mclellan et al. | 438/106 |
| 6,271,580 B1* | 8/2001 | Corisis | 257/666 |
| 6,277,673 B1* | 8/2001 | Corisis | 438/123 |
| 6,310,390 B1* | 10/2001 | Moden | 257/668 |
| 6,399,414 B1* | 6/2002 | Hayami | 438/106 |
| 6,414,385 B1* | 7/2002 | Huang et al. | 257/690 |
| 6,433,277 B1 | 8/2002 | Glenn | |
| 6,437,429 B1* | 8/2002 | Su et al. | 257/666 |
| 6,444,498 B1 | 9/2002 | Huang et al. | |
| 6,445,061 B2* | 9/2002 | Corisis | 257/666 |
| 6,455,356 B1* | 9/2002 | Glenn et al. | 438/123 |
| 6,552,416 B1* | 4/2003 | Foster | 257/666 |
| 6,552,427 B2* | 4/2003 | Moden | 257/692 |
| 6,559,525 B2* | 5/2003 | Huang | 257/675 |
| 6,605,865 B2* | 8/2003 | Jeong et al. | 257/670 |
| 6,611,047 B2* | 8/2003 | Hu et al. | 257/666 |
| 6,627,977 B1* | 9/2003 | Foster | 257/666 |
| 6,630,371 B2 | 10/2003 | Hembree | |
| 6,630,728 B2* | 10/2003 | Glenn | 257/670 |
| 6,667,541 B1* | 12/2003 | Minamio et al. | 257/666 |
| 6,674,154 B2* | 1/2004 | Minamio et al. | 257/666 |
| 6,677,663 B1* | 1/2004 | Ku et al. | 257/666 |
| 6,684,496 B2* | 2/2004 | Glenn | 29/841 |
| 6,686,651 B1* | 2/2004 | Foster | 257/666 |
| 6,700,189 B2* | 3/2004 | Shibata | 257/684 |
| 6,700,206 B2* | 3/2004 | Kinsman | 257/777 |
| 6,710,430 B2* | 3/2004 | Minamio et al. | 257/666 |
| 6,713,322 B2* | 3/2004 | Lee | 438/123 |
| 6,716,668 B2* | 4/2004 | Hayami | 438/106 |
| 6,720,207 B2* | 4/2004 | Minamio et al. | 438/123 |
| 6,791,166 B1* | 9/2004 | Foster | 257/666 |
| 6,798,046 B1* | 9/2004 | Miks | 257/666 |
| 6,818,973 B1* | 11/2004 | Foster | 257/676 |
| 6,825,062 B2* | 11/2004 | Yee et al. | 438/106 |
| 6,830,961 B2* | 12/2004 | Corisis | 438/123 |
| 6,927,478 B2* | 8/2005 | Paek | 257/666 |
| 6,958,528 B2* | 10/2005 | Corisis | 257/676 |
| 7,026,192 B2* | 4/2006 | Minamio et al. | 438/123 |
| 2001/0030355 A1* | 10/2001 | Mclellan et al. | 257/666 |
| 2001/0031553 A1* | 10/2001 | Corisis | 438/666 |
| 2001/0045629 A1* | 11/2001 | Corisis | 257/666 |
| 2002/0056856 A1* | 5/2002 | Mclellan et al. | 257/200 |
| 2002/0109214 A1* | 8/2002 | Minamio et al. | 257/676 |
| 2002/0121650 A1* | 9/2002 | Minamio et al. | 257/200 |
| 2002/0121670 A1* | 9/2002 | Minamio et al. | 257/459 |
| 2002/0160552 A1* | 10/2002 | Minamio et al. | 438/108 |
| 2002/0180008 A1* | 12/2002 | Corisis | 257/666 |
| 2002/0192862 A1* | 12/2002 | Moden | 438/106 |
| 2003/0001289 A1* | 1/2003 | Yamada et al. | 257/783 |
| 2003/0067059 A1* | 4/2003 | Corisis | 257/666 |
| 2003/0102537 A1* | 6/2003 | McLellan et al. | 257/666 |
| 2003/0127711 A1* | 7/2003 | Kawai et al. | 257/666 |
| 2004/0021229 A1* | 2/2004 | Kinsman | 257/777 |
| 2004/0053447 A1* | 3/2004 | Foster et al. | 438/123 |

OTHER PUBLICATIONS

*Internet Article*: Ultra BGA, "Circuitize the Heatsink", *Substrate Technologies, Inc.—Ultra Technology Family*.

* cited by examiner

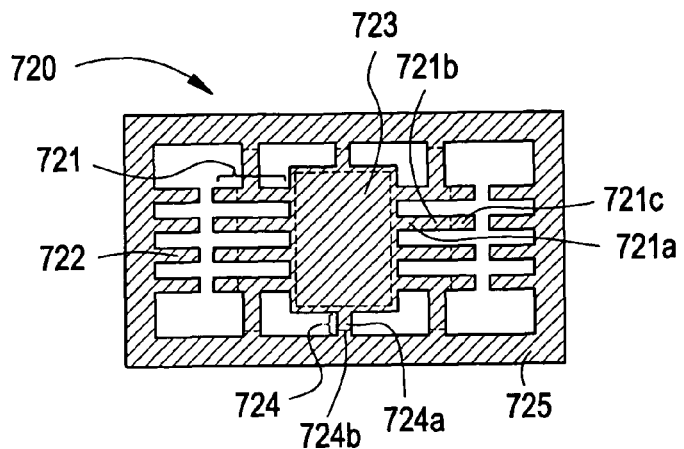
FIG. 7A
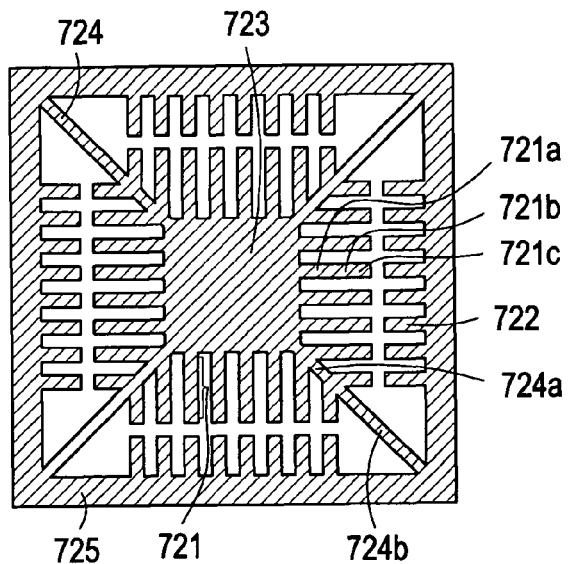
FIG. 7B
FIG. 7C
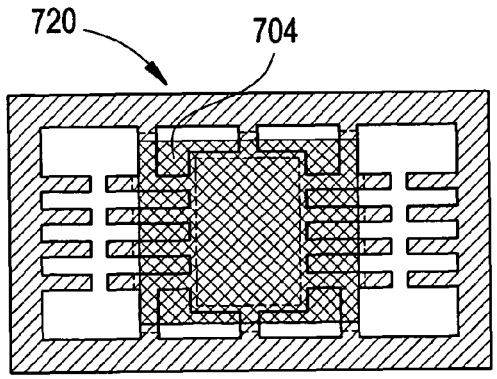
FIG. 7D
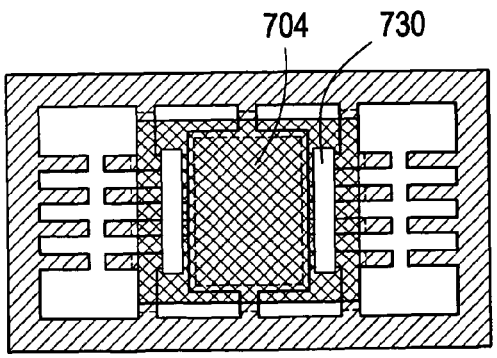

Effective lead pitch > 0

Section A-A'

HIGH DENSITY CHIP SCALE LEADFRAME PACKAGE AND METHOD OF MANUFACTURING THE PACKAGE

This application claims the benefit of the U.S. Provisional Application No. 60/429,315, filed on Nov. 27, 2002, and incorporated herein by reference.

BACKGROUND OF THE INVENTION

1. Field of the Invention

The present invention generally relates to the field of semiconductors. In particular, the present invention relates to an improved high density chip scale leadframe package and a method of assembling the same.

2. Discussion of Related Art

Semiconductors are materials that have characteristics of insulators and conductors. In today's technology, semiconductor materials have become extremely important as the basis for transistors, diodes, and other solid-state devices. Semiconductors are usually made from germanium or silicon, but selenium and copper oxide, as well as other materials, are also used. When properly made, semiconductors will conduct electricity in one direction better than they will in the other direction.

Semiconductor devices and integrated circuits (ICs) are made up of components, such as transistors and diodes, and elements, such as resistors and capacitors, linked together by conductive connections, to form one or more functional circuits. Interconnects on an IC chip serve the same function as the wiring in a conventional circuit.

The input/output functions of an IC are performed by leads which form a link between the IC chip and a substrate. "Lead pitch" is the term given to the spacing between these leads as they are laid out within the IC package. Conventional lead pitch is usually between 1.0 mm and 0.4 mm. as they are laid out within the IC package. Conventional lead pitch is usually between 1.0 mm and 0.4 mm.

Emerging electronic product applications are creating a set of challenges for the IC packaging industry.

Once the IC chips have been produced and encapsulated in semiconductor packages as described, they may be used in a wide variety of electronic appliances. The variety of these electronic devices utilizing semiconductor packages has grown dramatically in recent years. These devices include cellular phones, portable computers, etc. Each of these devices typically includes a motherboard on which a significant number of such semiconductor packages are secured to provide multiple electronic functions. These electronic appliances are typically manufactured in reduced sizes and at reduced costs, which results in increased consumer demand. It is increasingly desirable, therefore, to reduce the footprint of the semiconductor package so that electronic systems can be incorporated into more compact devices and products.

One way to reduce the size of the footprint of IC packages utilizing leadframes is to reduce the lead pitch.

SUMMARY OF THE INVENTION

An IC package according to the present invention comprises a die pad having a first face and a second face opposite to the first face. The package also comprises a plurality of inner leads, each having a first face, a second face-opposite to the first face, and a plurality of sides between the first face and the second face. The plurality of inner leads is disposed substantially co-planar with, and substantially around, the die pad. The package also comprises a plurality of outer leads having a first face, a second face opposite to the first face, and a plurality of sides between the first face and the second face. The plurality of outer leads is disposed substantially co-planar with, and substantially around, the plurality of inner leads and the die pad. The sides of each of the plurality of outer leads are substantially offset from the sides of each the plurality of inner leads. The package also comprises a first adhesive layer disposed on the first face of the die pad and a second adhesive layer disposed on the first face of each of the plurality of inner leads. The package also comprises an IC chip having a first face and a second face opposite to the first face. The second face of the IC chip is coupled to the first face of the die pad through the first adhesive layer and is further coupled to the first faces of each of the plurality of inner leads through the second adhesive layer. The package further comprises a first plurality of wires linking the plurality of inner leads to the IC chip. Each of the first plurality of wires comprises a first end electrically conductively joined to the first face of one of the plurality of inner leads and a second end electrically conductively joined to the first face of the IC chip. The package further comprises a second plurality of wires linking the plurality of outer leads to the IC chip. Each of the second plurality of wires comprises a first end electrically conductively joined to the first face of one of the plurality of outer leads and a second end electrically conductively joined to the first face of the IC chip.

According to one aspect of the first exemplary embodiment, the IC package further comprises an encapsulant which surrounds at least the first face of the die pad, the first faces of the plurality of inner leads, the first faces of the plurality of outer leads, the first adhesive layer, the second adhesive layer, the first plurality of wires, the second plurality of wires, and the IC chip.

According to another aspect of the first exemplary embodiment, the IC package further comprises a conductive element having a first face and a second face opposite to the first face. The conductive element is sandwiched between the die pad and the IC chip so that the second face of the conductive element is coupled to the first face of the die pad and further to the first faces of each of the plurality of inner leads, and the first face of the conductive element is coupled to the second face of the IC chip. The package further comprises a first linking wire linking the IC chip to the conductive element and a second linking wire linking the conductive element to the die pad.

According to a second exemplary embodiment of the present invention, the IC package comprises a die pad having a first face and a second face opposite to the first face. The package also comprises a plurality of inner leads each having a first face, a second face opposite to the first face, and a plurality of sides between the first face and the second face. The package also comprises a plurality of outer leads, each having a first face, a second face opposite to the first face, and a plurality of sides between the first face and the second face the sides of each of the plurality of outer leads are substantially offset from the sides of each of the plurality of inner leads. The package also comprises a first adhesive layer disposed on the first face of the die pad and a second adhesive layer disposed on the first faces of the plurality of inner leads. The package further comprises a first IC chip having a first face and a second face opposite to the first face. The second face of the first IC chip is coupled to the first face of the die pad through the first adhesive layer and further coupled to the first faces-of the plurality of inner leads through the second adhesive layer. The package further comprises a third adhesive layer disposed on the first face of the first IC chip, and a second IC chip having a first face and a second face opposite to the first face. The second face of the second IC chip is coupled to the first face of the first IC chip through the third adhesive layer. The package also comprises a first plurality of wires linking the plurality of inner leads to the first IC chip, and a second plurality of wires linking the plurality of outer leads to the second IC chip.

According to one aspect of the second exemplary embodiment of the present invention, the package further comprises an encapsulant surrounding at least the first face of the die pad, the first faces of the plurality of inner leads, the first faces of the plurality of outer leads, the first adhesive layer, the second adhesive layer, the first IC chip, the third adhesive layer, the second IC chip, the first plurality of wires, and the second plurality of wires.

According to a third exemplary embodiment of the present invention, a leadframe for an IC package comprises an outer frame portion, a die pad portion substantially centrally disposed within the outer frame portion, a plurality of inner lead portions extending substantially radially outward from the central die pad portion, a plurality of outer lead portions extending substantially radially inward from said outer frame portion, and a plurality of tie bars connecting the die pad portion to the outer frame portion.

According to a fourth exemplary embodiment of the present invention, a leadframe for an IC package comprises an outer frame portion, a die pad portion substantially centrally disposed within the outer frame portion, and a plurality of tie bars connecting the die pad to the outer frame portion. The leadframe further comprises a plurality of protuberances extending substantially radially inward from the outer frame portion. Each of the protuberances comprises an inner lead portion, and outer lead portion, and a post portion connecting the inner lead portion to the outer lead portion. The post portion has a substantially smaller width than either the inner lead portion or the outer lead portion.

According to a fifth exemplary embodiment of the present invention, a method of assembling an IC package comprises providing: a die pad having a first face and a second face opposite to the first face; a plurality of inner leads each having a first face and a second face opposite to the first face, and a plurality of sides between the first face and the second face; a plurality of outer leads each having a first face and a second face opposite to the first face, and a plurality of sides between the first face and the second face; an IC chip having a first face and a second face opposite to the first face; and a conductive element having a first face and a second face opposite to the first face. The method further comprises disposing the inner leads substantially co-planar with and substantially around the die pad and disposing the outer leads substantially co-planar with and substantially around the inner leads and the die pad. The plurality of sides of the outer leads are offset from the plurality of sides of the inner leads. The method also comprises coupling the second face of the conductive element to the first face of the die pad through a first adhesive layer, and to the first faces of the plurality of inner leads through a second adhesive layer. The method also comprises coupling the second face of the IC chip to the first face of the conductive element through a third adhesive layer. The method further comprises electrically conductively linking the plurality of inner leads to the first face of the IC chip, the plurality of outer leads to the first face of the IC chip, the first face of the IC chip to the conductive element and the conductive element to the die pad.

According to an aspect of the fifth exemplary embodiment of the present invention, the method further comprises coupling the second face of the die pad, the second faces of the plurality of inner leads, and the second faces of the plurality of outer leads to a printed circuit board though a fourth adhesive layer.

According to a sixth exemplary embodiment of the present invention, a method of assembling an IC chip comprises providing a leadframe having a first face and a second face opposite to the first face. The leadframe comprises an outer frame portion, a die pad portion substantially centrally disposed within the outer frame portion, a plurality of inner lead portions extending substantially radially outward from the die pad portion, a plurality of outer lead portions extending substantially radially inward from the outer frame portion, and a plurality of tie bars connecting the die pad portion to the outer frame portion. Each of the inner lead portions comprises an inner portion, a central portion, and an outer portion. Each of the tie bars comprises an inner portion and an outer portion. The method also comprises providing an IC chip having a first face and a second face opposite to the first face, a first plurality of wires each having a first end and a second end, and a second plurality of wires each having a first end and a second end. The method also comprises disposing a first adhesive layer on the first face of the leadframe. The first adhesive layer covers the die pad portion, the inner portion and the central portion of the plurality of inner lead portions, and the inner portion of the plurality of tie bars the outer portion of the plurality of inner lead portions remains free from adhesive. The method also comprises severing the outer and central portions of the plurality of inner lead portions from the inner portions of the plurality of inner lead portions and from the die pad portion. The method also comprises mounting the IC chip on the leadframe. The second face of the IC chip is connected to the first face of the die pad portion and to the first faces of each of the plurality of inner lead portions through the first adhesive layer. The method further comprises electrically conductively joining the first end of each of the first plurality of wires to the first face of the outer portion of each of the plurality of inner lead portions, electrically conductively joining the second end of each of the first plurality of wires to the first face of the IC chip, electrically conductively joining the first end of each of the second plurality of wires to the first faces of each of the plurality of outer leads, and electrically conductively joining the second end of the second plurality of wires to the first face of the IC chip.

According to a seventh embodiment of the present invention, a method of assembling an IC package comprises providing a leadframe having a first face and a second face opposite to the first face. The leadframe comprises an outer frame portion, a die pad portion substantially centrally disposed within the outer frame portion, a plurality of tie bars connecting the die pad portion to the outer frame portion, and a plurality of protuberances extending substantially radially inward from the outer fame portion. Each of the plurality of protuberances comprises an inner lead portion, an outer lead portion, and a post portion connecting the inner lead portion to the outer lead portion. The method also comprises providing an IC chip having a first face and a second face opposite to the first face, a first plurality of wires each having a first end and a second end, and a second plurality of wires each having a first end and a second end. The method also comprises disposing an adhesive layer on the first face of the leadframe, whereby the adhesive layer covers the die pad portion, and part of the outer lead portion of each of the plurality of protuberances, so that a part of each outer lead portion remains free of adhesive. According to an aspect of the seventh exemplary embodiment of the present invention, the adhesive layer can cover only an outer edge of the die pad portion, thereby leaving a central part of the die pad portion free from adhesive. The method also comprises severing the outer lead portion from the inner lead portion by cutting the post portion. The method also comprises mounting the IC chip on the leadframe, whereby the second face of the IC chip is connected to the first face of the die pad portion and to the first faces of the outer lead portions through the adhesive layer. The method further comprises electrically conductively joining the first end of the first plurality of wires to the first face of the plurality of outer lead portions, the second end of each of the first plurality of wires to the first face of the IC chip, the first end of each of the second plurality of wires to the first face of one of the inner lead portions, and the second end of the second plurality of wires to the first face of the IC chip.

BRIEF DESCRIPTION OF THE DRAWINGS

These and other features, aspects, and advantages of the present invention will become better understood with reference to the following description, amended claims, and accompanying drawings, which should not be read to limit the invention in any way, in which:

FIGS. 7A-7D are plane views of a leadframe according to a third exemplary embodiment of the present invention.

DETAILED DESCRIPTION OF THE INVENTION

The present invention will be explained in further detail with reference to the accompanying drawings.

Figure 1:
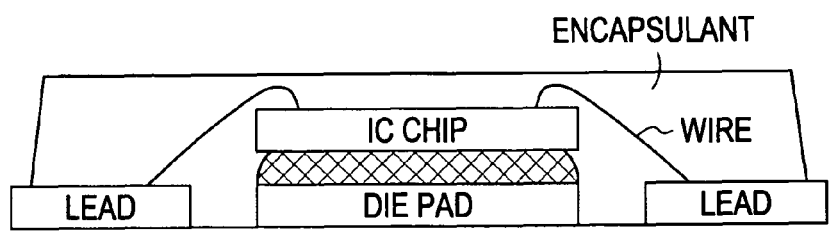
FIG. 1 is a cross-section of a conventional IC package.
Figure 2A:
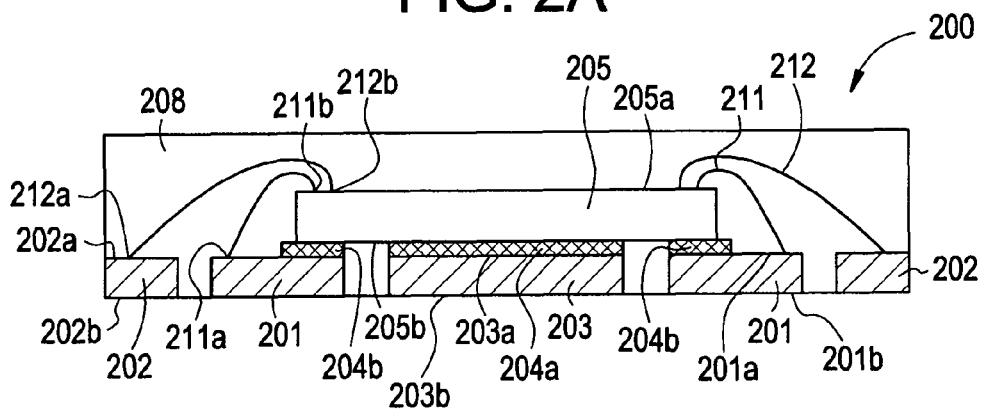
FIG. 2A is a cross-section of an IC package according to a first exemplary embodiment of the present invention.
Figure 2B:
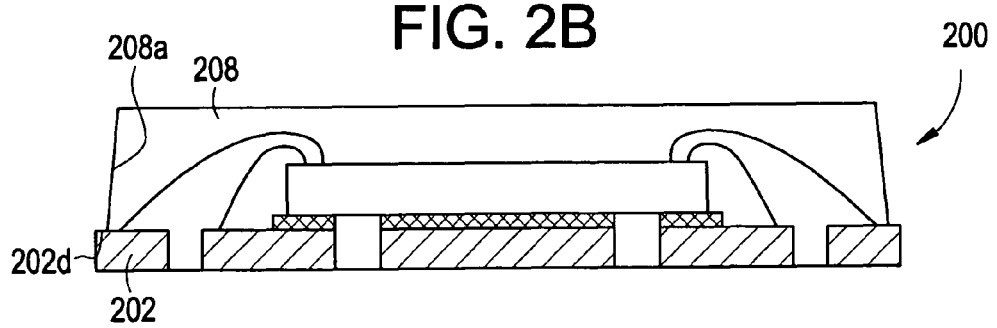
FIG. 2B is an alternative cross-section of an IC package according to a first exemplary embodiment of the present invention.
Figure 3:
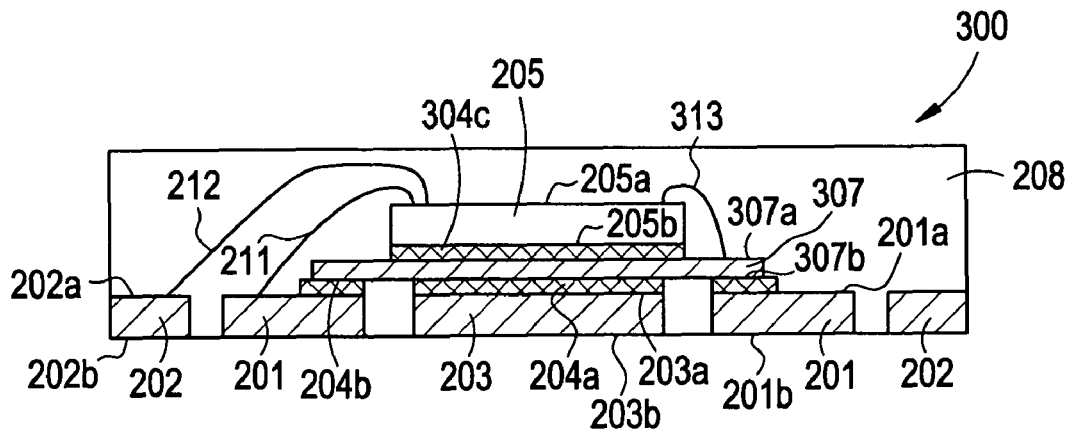
FIG. 3 is a cross section of an IC package according to one aspect of the first exemplary embodiment of the present invention.
Figure 4:
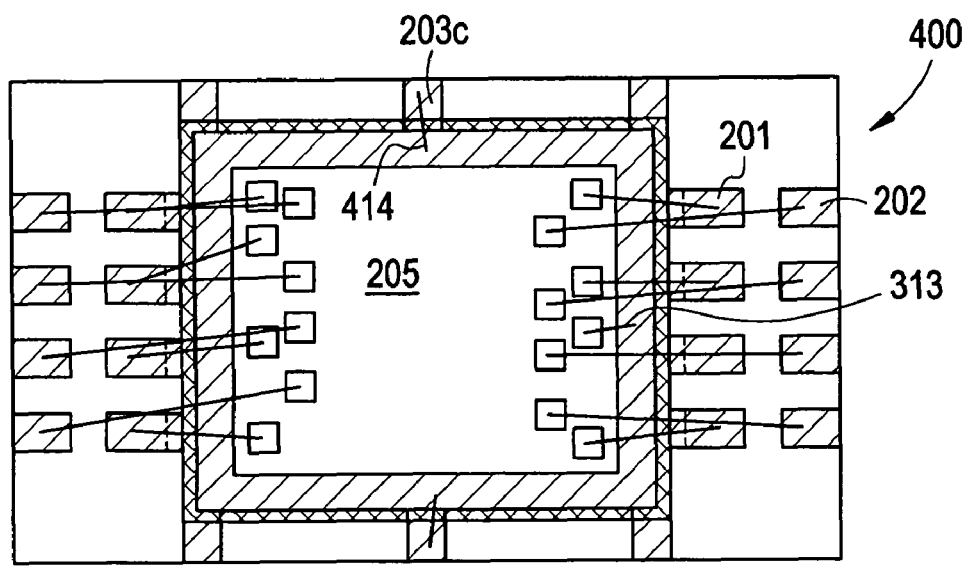
FIG. 4 is a plane view of the IC package of FIG. 3.
Figure 5:
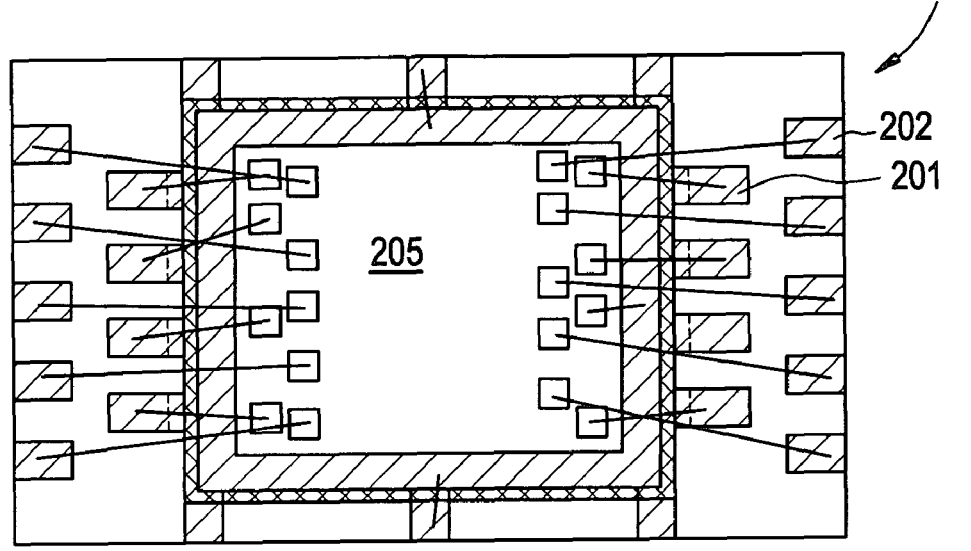
FIG. 5 is a plane view of an alternate layout of the IC package of FIG. 3.

FIGS. 2-4 illustrate a cross-section of an IC package according to a first exemplary embodiment of the present invention. The IC package 200 of FIG. 2A or 2B comprises a die pad 203 having a first face 203a and a second face 203b opposite to the first face. Hereinafter, the terms "first" and "second" are merely used for convenience and do not reflect the order of formation, placement, or observation. A plurality of inner leads 201, as shown, each have a first face 201a, a second face 201b, and a plurality of sides 201c (shown in FIG. 4) between the first face 201a and the second face 102b. The plurality of inner leads 201 are disposed substantially co-planar with and substantially around the die pad 203, as shown in FIG. 4. The plurality of inner leads 201 may border only two sides of the die pad 203 or may substantially completely encircle the die pad 203. A plurality of outer leads 202, as shown, each have a first face 202a, a second face 202b, and a plurality of sides 202c (shown in FIG. 4) between the first face 202a and the second face 202b. The plurality of outer leads 202 are disposed substantially co-planer with and substantially around the plurality of inner leads 201 and the die pad 203, as shown in FIG. 4. As with the plurality of inner leads, the plurality of outer leads 202 may border the plurality of inner leads 201 and the die pad 203 on only two sides, or they may substantially completely encircle the plurality of inner leads 201 and the die pad 203. The plurality of sides 202c of the plurality of outer leads 202 may be aligned with the plurality of sides 201c of the plurality of inner leads 201, as shown in FIG. 4. In this way, the lead pitch, or effective spacing between one lead and the next becomes zero because the leads effectively overlap with each other. Alternately, the plurality of sides 202c of the plurality of outer leads 202 may be offset from the plurality of sides 201c of the plurality of inner leads 201, as shown in FIG. 5, thus creating an effective lead pitch of greater than zero. These layouts enable a higher pin count within a given area of IC package footprint. The die pad 203, the first plurality of leads 201, and the second plurality of leads 202 can be composed of a common copper alloy, such as C194, C7025, C151, or Eftec64T, for example.

A first adhesive, 204a is disposed on the first face 203a of the die pad 203. A second adhesive, 204b is disposed on the first face 201a of each of the plurality of inner leads 201. The adhesive used for the adhesive layers 204a and 204b may comprise, for example, electrically conductive or non-conductive epoxy, paste, or adhesive film, or the like as would be understood by those skilled in the art, and are intended to be encompassed here.

The IC package 200 also comprises an IC chip 205 having a first face 205a and a second face 205b. The second face 205b of the IC chip 205 is coupled to the first face of the die pad 203a through the first adhesive layer 404a. The second face 205b of the IC chip 205 is further coupled to the first faces 201a of the plurality of inner leads 201 through the second adhesive layer 204b. This dual coupling of the IC chip 205 adds stability to the overall structure of the IC package 200 and also functions to maintain the proper position of the inner leads 201.

The IC package 200 further comprises a first plurality of wires 211 linking the plurality of inner leads 201 to the IC chip 205. Each of the first plurality of wires 211 has a first end 211a electrically conductively joined to the first face 201 a of one of the plurality of inner leads 201, and a second end 211b electrically conductively joined to the first face 205a of the IC chip 205. The package also comprises a second plurality of wires 212, as shown, each having a first end 212a electrically conductively joined to the first face 202a of one of the plurality of outer leads 202, and a second end 212b electrically conductively joined to the first face 205a of the IC chip 205. The first plurality of wires 211 and the second plurality of wires 212 can be composed of gold, gold with some level of impurities, aluminum, or copper, for example. For use in wires 211 and 212, the gold may contain 1% impurities. These impurities could include dopants or additives included to improve the properties of the wires as would be understood by one of skill in the art.

According to one aspect of the first exemplary embodiment of the present invention, the IC package 200 may further comprise an encapsulant 208. As shown in FIG. 2A, the encapsulant may surround at least the first face 203a of the die pad 203, the first faces 201a of the plurality of inner leads 201, the first faces 202a of the plurality of outer leads 202, the first adhesive layer 204a, the second adhesive layer 204b, the first plurality of wires 211, the second plurality of wires 212, and the IC chip 205. As shown in FIG. 2B, the encapsulant may alternatively end before the outer edges of the plurality of leads 202. In this alternative aspect, the encapsulant forms and edge 208a which leaves a portion 202d of each of the plurality of leads 202 exposed. In both alternatives, the encapsulant 208 provides overall protection to the elements it surrounds and gives added strength to the package. The encapsulant can be a polymer-based molding compound or any other of many known encapsulant materials as would be understood by one of ordinary skill in the art.

With reference to FIGS. 3 and 4 or 5, and according to another aspect of the first exemplary embodiment of the present invention, the IC package can further comprise a conductive element 307 having a first face 307a and a second face 307b opposite to the first face. The conductive element 307 is sandwiched with adhesive layers between the die pad 203 and the IC chip 205. The second face 307b of the conductive element 307 is coupled to the first face 203a of the die pad through the first adhesive layer 204a and to the first face 201a of the plurality of inner leads 201 through the second adhesive layer 204b. The first face 307a of the conductive element 307 is coupled to the second face 205b of the IC chip 205 through a third adhesive layer 304c. As with the first and second adhesive layers 204a and 204b, the third adhesive layer 304c may comprise, for example, electrically conductive or non-conductive epoxy, paste, or adhesive film, or the like as would be understood by one of skill in the art.

The IC package 300, 400, or 500 further comprises at least one first linking wire 313 linking the IC chip 205 to the conductive element 307. The at least one first linking wire 313 has a first end 313a electrically conductively joined to the first face 307a of the conductive element 307, and a second end 131b electrically conductively joined to the first face 205a of the IC chip 205. At least one second linking wire 414 (shown in FIG. 4) comprises a first end 414a electrically conductively joined to the first face 307a of the conductive element 307 and a second end 414b electrically conductively joined to the first face 203a of the die pad 203. For this purpose, the die pad, 203 may have at least one lateral portion 203c, as shown in FIG. 4, which protrudes beyond the conductive element 307.

Figure 6:
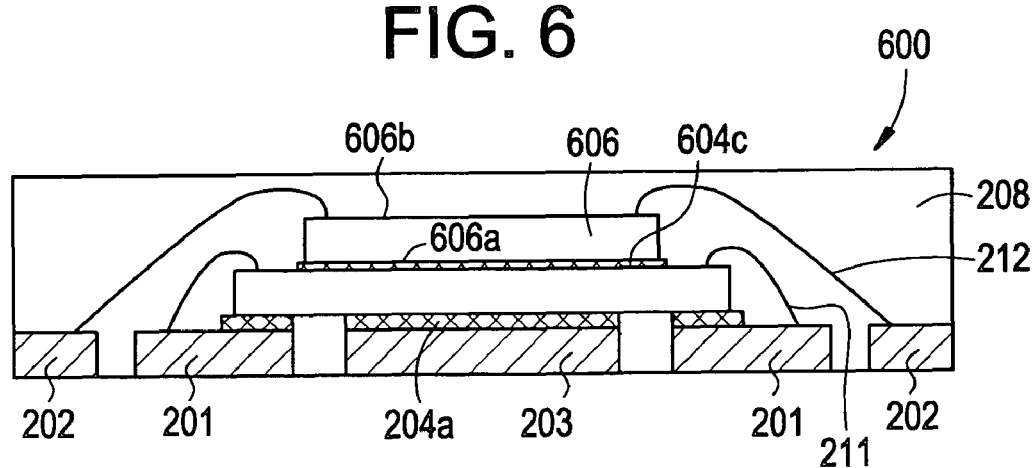
FIG. 6 is a cross section of an IC package according to a second exemplary embodiment of the present invention.

FIG. 6 illustrates a cross-section of an IC package 600 according to a second exemplary embodiment of the present invention. As described above with reference to FIGS. 2-5, the IC package 600 of FIG. 6 comprises a die pad 203, a plurality of inner leads 201, a plurality of outer leads 202, a first adhesive layer 204a, a second adhesive layer 204b, an IC chip 205, and a first plurality of wires 211. These elements are described with reference to FIGS. 2-5, and are disposed and interconnected as therein described.

The IC package 600 of FIG. 6 further comprises a third adhesive layer 604c disposed on the first face 205a of the IC chip 205. As with the first and second adhesives 204a and 204b, the third adhesive layer 604c may comprise, for example, electrically conductive or non-conductive epoxy, paste, or adhesive film, or the like as would be understood by one of skill in the art. The IC package 600 further comprises a second IC chip 606 having a first face 606a and a second face 606b. The second face 606b of the second IC chip 206 is connected to the first face 205a of first IC chip 205 through the third adhesive layer 604c.

As in IC package 200, the IC package 600 further comprises a second plurality of wires 212. According to this embodiment, the second plurality of wires link the plurality of outer leads 202 to the second IC chip 606. Each of the second plurality of wires 212 has a first end 212 a electrically conductively joined to the first face 202a of one of the plurality of outer leads 202, and a second end 212b electrically conductively joined to the first face 606a of the second IC chip 606.

According to one aspect of the second exemplary embodiment of the present invention, IC package 600 can further comprise an encapsulant 208 as described with reference to the first exemplary embodiment and FIGS. 2 and 3. According to the present aspect, the encapsulant 208 further surrounds the third adhesive layer 604c and the second IC chip 606.

With reference to FIGS. 7A-7B, 8A, and 9A, the die pad 203, the plurality of inner leads 201 and the plurality of outer leads 212 of the first and second exemplary embodiments of the present invention can be formed from leadframe 720 or 820, respectively.

FIGS. 7A-7B illustrate a leadframe 720 according to a third exemplary embodiment of the present invention. Leadframe 720 comprises an outer frame portion 725 and a die pad portion 723. The die pad portion 723 is substantially centrally disposed with in the outer frame portion 725. The leadframe 720 also comprises a plurality of inner lead portions 721 extending substantially radially outward from the central die pad portion 723. The leadframe also comprises a plurality of outer lead portions 722 extending substantially radially inward from said outer frame portion 725. The leadframe also comprises a plurality of tie bars 724 connecting the die pad portion 723 to the outer frame portion 725. According to the third exemplary embodiment of the present invention, the above-mentioned elements of the leadframe 720 may be arranged, for example, as illustrated in FIG. 7A or in FIG. 7B, or according to another arrangement as would be understood by one of ordinary skill in the art. The leadframe 720 can be composed of a common copper alloy, such as C194, C7025, C151, or Eftec64T, for example.

Figure 8A:
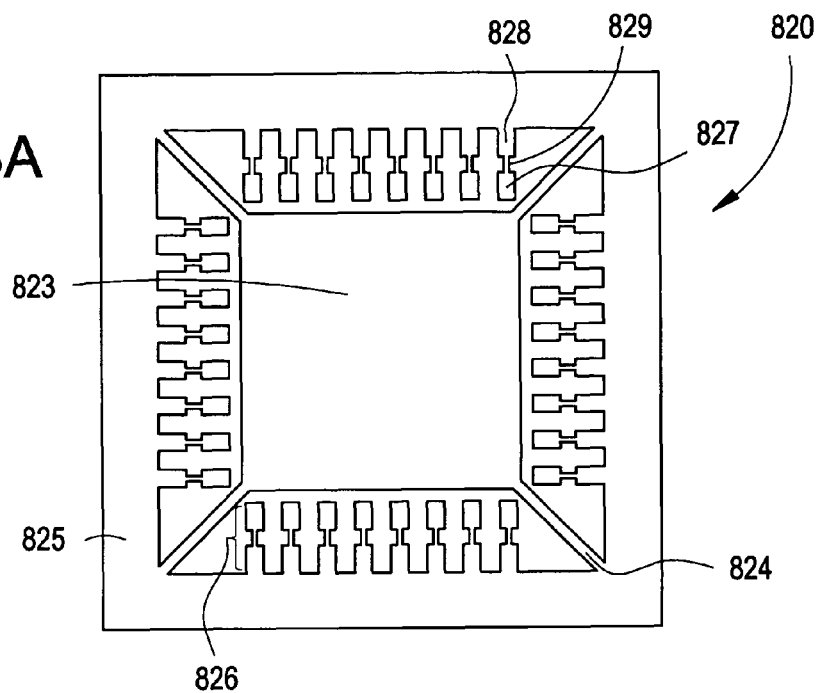
FIGS. 8A-8D are plane views of a leadframe according to a fourth exemplary embodiment of the present invention.
Figure 9A:
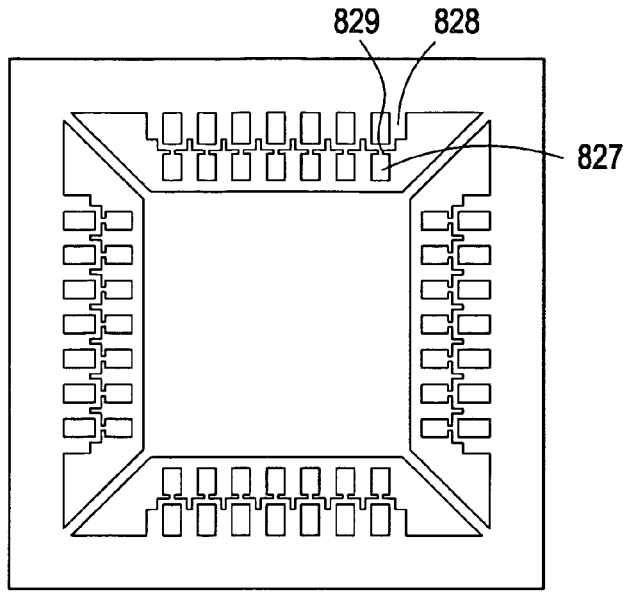
FIGS. 9A-9C are plane views of an alternative leadframe according to a fourth exemplary embodiment of the present invention.
Figure 9B:
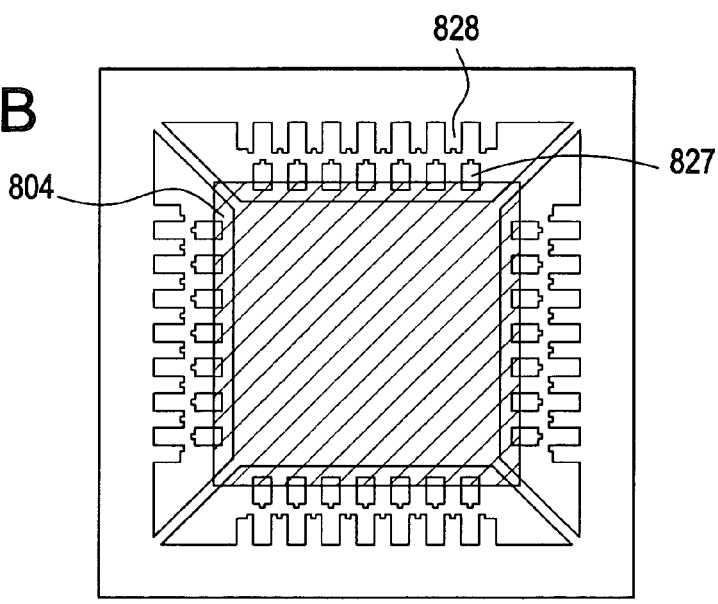
Figure 9C:
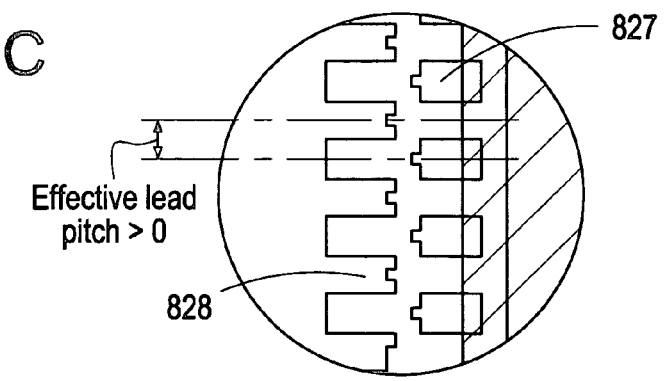

FIGS. 8A and 9A illustrate alternate leadframes 820 according to a fourth exemplary embodiment of the present invention. With exemplary reference to FIG. 8A, leadframe 820 comprises an outer frame portion 825, a die pad portion 823, a plurality of tie bars 824 connecting the die pad portion 823 to the outer frame portion 825, and a plurality of protuberances 826. The die pad portion 823 is substantially centrally disposed within the outer frame portion 825. The plurality of protuberances 826 extend substantially radially inward from the outer frame portion 825, and each comprises an inner lead portion 827, an outer lead portion 828, and a post portion 829 connecting the inner lead portion 827 to the outer lead portion 828. The outer lead portion 828 is connected to the outer frame portion 825. The post portion 829 has a substantially smaller width than either the inner lead portion 827 or the outer lead portion 828. As with leadframe 720, leadframe 820 can be composed of a common copper alloy, such as C194, C7025, C151, or Eftec64T, for example. As shown in FIG. 8A, the post portion 829 may be straight, such that the plurality of inner lead portions 827 and the plurality of outer lead portions 828 are aligned, and there is an effective lead pitch of zero. Alternately, as shown in FIG. 9A, the post portion 829 may be bent, thus creating an offset between the plurality of inner lead portions 827 and the plurality of outer lead portions 828. According to this aspect, illustrated in FIG. 9A, there is an effective lead pitch of greater than zero, as shown in FIG. 9C.

Figure 10A:
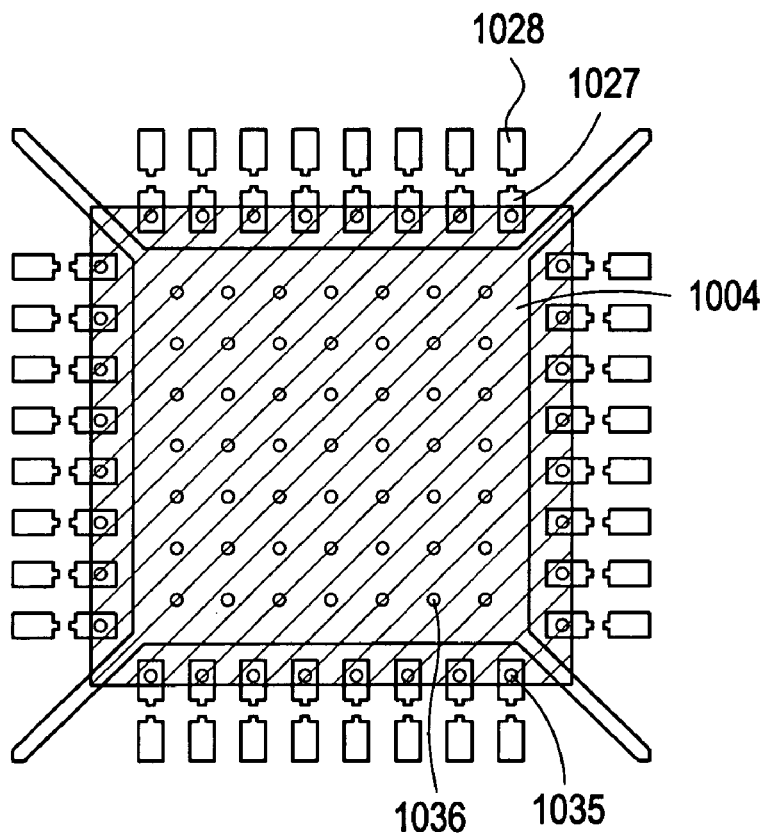
FIGS. 10A-10C are plane views of an aspect of a leadframe according to a third or fourth exemplary embodiment of the present invention.
Figure 10B:
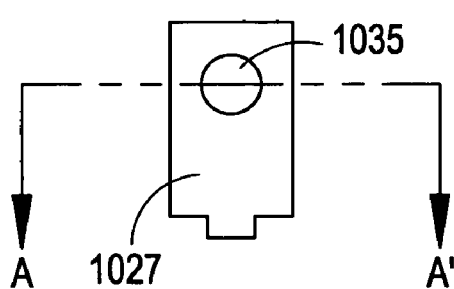
Figure 10C:
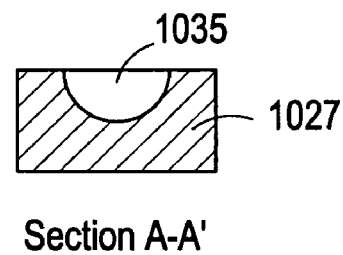

FIGS. 10A-10C illustrate a possible aspect of the leadframes according to the third and fourth exemplary embodiments. According to this aspect, there is a dimple 1035 disposed on a first face of each of the plurality of inner lead portions. There are a plurality of dimples 1036 disposed on a first face of the die pad portion. These dimples may be formed from mechanical or chemical processes. The dimples increase the surface area of the lead portions and the die pad on which an adhesive is disposed, as described with respect to the sixth and seventh embodiments of the present invention, thereby making the connection between the first faces of the inner lead portions of the die pad portion and another element through the adhesive stronger.

Hereinafter, the elements discussed with respect to the following embodiments and aspects are similar to those discussed with respect to the aforementioned embodiments and aspects and may comprise the same exemplary materials and constructions as discussed above.

According to a fifth exemplary embodiment, and with exemplary reference to FIGS. 3 and 4, a method of assembling an IC package comprises providing a die pad 203 having a first face 203a and a second face 203b opposite to the first face; a plurality of inner leads 201 each having a first face 201a, a second face 201b opposite to the first face, and a plurality of sides 201c between the first face and the second face; a plurality of outer leads 202, each having a first face 202a, a second face 202b opposite to the first face, and a plurality of sides 202c between the first face and the second face, an IC chip 205 having a first face 205a and a second face 205b opposite to the first face, and a conductive element 307 having a first face 307a and a second face 307b opposite to the first face. The method further comprises disposing the inner leads 201 substantially co-planar with and substantially around the die pad 203, as described with respect to the second exemplary embodiment of the present invention. The method further comprises disposing the plurality of outer leads 202 substantially co-planar with and substantially around the inner leads 201 and the die pad 203, as also described with respect to the second exemplary embodiment of the present invention. The sides 201c of the plurality of inner leads 201 and the sides 202c of the plurality of outer leads may be aligned or offset from each other, as explained with respect to FIGS. 2, 4, and 5 and the first exemplary embodiment of the present invention. This alignment or offsetting allows the effective lead pitch of this embodiment to be zero or greater than zero.

The method according to the fifth embodiment of the present invention further comprises coupling the second face 307b of the conductive element 307 to the first face 203a of the die pad through a first adhesive layer 204a, and to the first faces 201a of the plurality of inner leads through a second adhesive layer 204b. The method also comprises coupling the second face 205b of the IC chip to the first face 307a of the conductive element through a third adhesive layer 304c. The method also comprises electrically conductively linking each of the plurality of inner leads 201 to the first face 205a of the IC chip, each of the plurality of outer leads 202 to the first face 205a of the IC chip 205, the first face 205a of the IC chip to the conductive element 307, and the conductive element 307 to the die pad 203.

According to one aspect of the fifth embodiment of the present invention, the method of assembling an IC package further comprises coupling the second face 203b of the die pad 203, the second faces 201b of the plurality of inner leads 201, and the second faces 202b of the plurality of outer leads to a printed circuit board through a fourth adhesive layer. The fourth adhesive layer can comprise a conductive adhesive film or an electrically conductive paste, such as, for example, solder paste.

According to a sixth exemplary embodiment of the present invention, and with exemplary reference to FIGS. 2 and 7A-7D, a method of assembling an IC package comprises providing a leadframe 720 having a first face and a second face opposite to the first face. The leadframe can be, for example, leadframe 720 of FIG. 7A or alternate leadframe 720 of FIG. 7B. With exemplary reference to FIG. 7A, the leadframe comprises an outer frame portion 725, a die pad portion 723, a plurality of inner lead portions 721 extending substantially radially outward from the die pad portion 723, a plurality of outer lead portions 722 extending substantially radially inward from the outer frame portion 725, and a plurality of tie bars 724 connecting the die pad portion 723 to the outer frame portion 725.

The die pad portion 723 is substantially centrally disposed within the outer frame portion 725. Each of the inner lead portions 721 comprises an inner portion 721a, a central portion 721b, and an outer portion 721c. Each of the tie bars 724 comprises an inner portion 724a and an outer portion 724b. The method also comprises providing an IC chip 205 having a first face 205a and a second face 205b, a first plurality of wires 211 each having a first end 211a and a second end 211b, and a second plurality of wires 212, each having a first end 212a and a second end 212b.

The method further comprises disposing a first adhesive layer 704 on the first face of the leadframe. As illustrated in FIG. 7C, the first adhesive layer 704 covers the die pad portion 723, the inner portion 721a and the central portion 721b of the plurality of inner lead portions 721, and the inner portion 724a of the plurality of tie bars 724. The outer portion 721c of the plurality of inner lead portions 721 remains free of adhesive. The method further comprises severing the outer and central portions 721b and 721c from inner portions 721a and the die pad 723. This severing can be accomplished mechanically or chemically by cutting slots 730 through the adhesive layer 704 and the inner lead portions 724, as illustrated in FIG. 7D. The method also comprises mounting the IC chip 205 on the leadframe, whereby the second face 205b of the IC chip 205 is connected to the first face of the die pad portion 723 and to the first faces of the inner lead portions 724 through adhesive layer 704. This step provides stability to the overall IC package and maintains the inner lead portions 724 in their proper positions. The method also comprises electrically conductively joining the first end 211a of each of the first plurality of wires 211 to the first face of each of the outer portions 724c of the plurality of inner lead portions 724 and electrically conductively joining the second end 211b of each of the first plurality of wires 211 to the first face 205a of the IC chip 205. The method also comprises electrically conductively joining the first end 212a of each of the second plurality of wires 212 to the first face of each of the plurality of outer lead portions 722 and electrically conductively joining the second end 212b of each of the second plurality of wires 212 to the first face 205a of the IC chip 205.

According to a seventh exemplary embodiment of the present invention, and with exemplary reference to FIGS. 2 and 8A-8D, a method of assembling an IC package comprises providing a leadframe 820 having a first face and a second face opposite to the first face. The leadframe comprises an outer frame portion 825, a die pad portion 823, a plurality of tie bars 824 connecting the die pad portion 823 to the outer frame portion 825, and a plurality of protuberances 826 extending substantially radially inward from the outer frame portion 825. The die pad portion 823 is substantially centrally disposed within the outer frame portion 825. Each of the plurality of protuberances comprises an inner lead portion 827, an outer lead portion 828, and a post portion 829 connecting the inner lead portion 827 to the outer lead portion 828 the method further comprises providing an IC chip 805 having a first face 805a and a second face 805b opposite to the first face, a first plurality of wires 811 each having a first end 811a and a second end 811b, and a second plurality of wires 812 each having a first end 812a and a second end 812b.

Figure 8B:
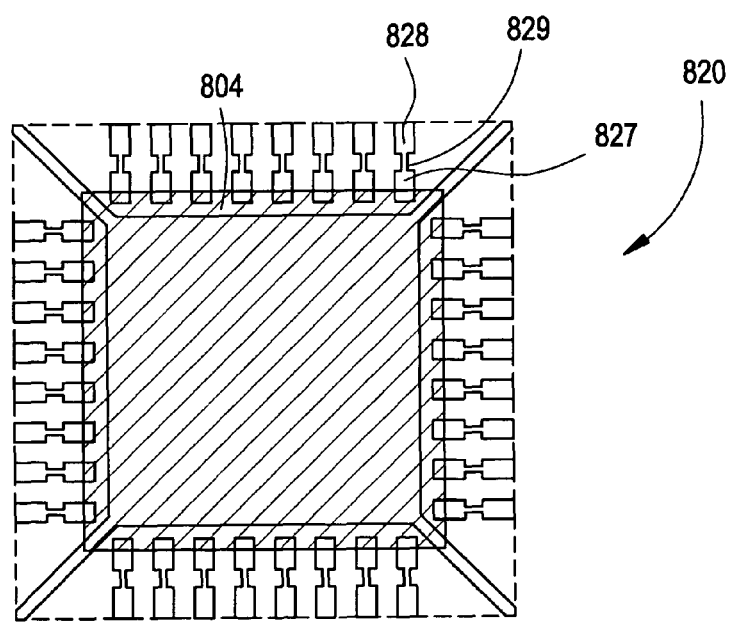

The method further comprises disposing an adhesive layer 804 on the first face of the leadframe. As illustrated in FIG. 8B, the adhesive layer 804 covers the die pad portion 823, and part of the inner lead portion 827 of each of the plurality of protuberances 826. Part of each inner lead portion 827 of each of the plurality of protuberances 826 remains free from adhesive 804. According to one aspect of the present embodiment, and as illustrated in FIG. 8D, the adhesive layer 804 can be disposed only on an outer edge of the die pad portion 823, thereby leaving a central window of the die pad portion 823 free from adhesive.

Figure 8C:
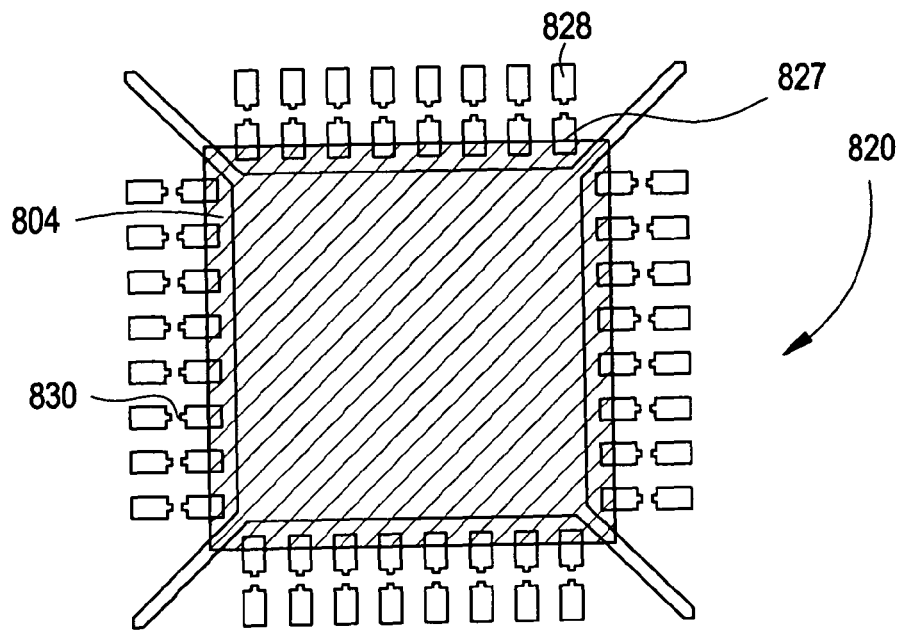
Figure 8D:
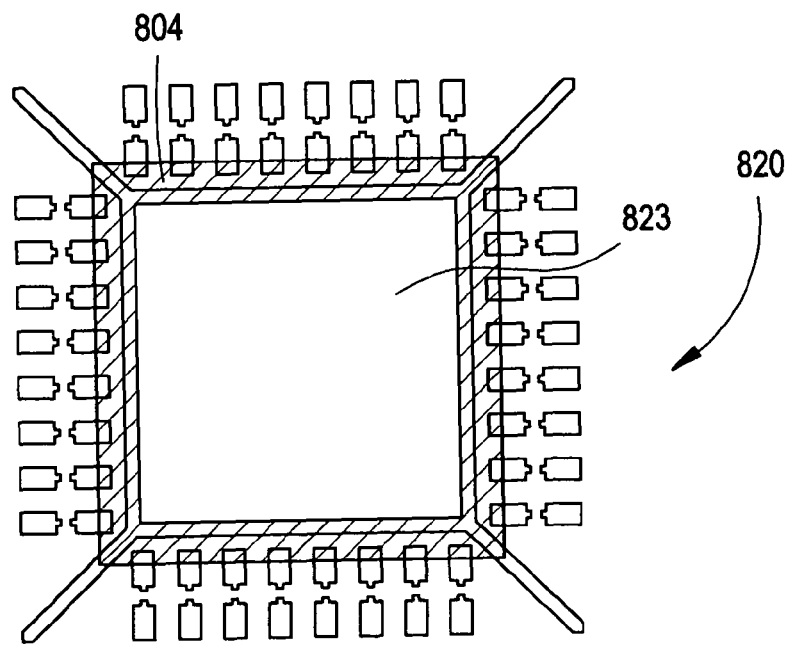

As illustrated in FIG. 8C, the method, according to the present embodiment, further comprises mechanically or chemically severing the inner lead portions 827 from the outer lead portions 828 by cutting the post portions 829. The method also comprises mounting the IC chip 205 on the leadframe 820 whereby the second face 205b of the IC chip 205 is connected to the first face of the die pad portion 823 and to the first faces of each of the plurality of inner lead portions 827 through the adhesive layer 804. As described with respect to the sixth exemplary embodiment of the present invention, this step provides stability to the overall IC package and maintains the inner lead portions 824 in their proper positions.

The method further comprises electrically conductively joining the first end 211a of each of the first plurality of wires 211 to the first face of one of the plurality of inner lead portions 827 and electrically conductively joining the second end 211b of each of the first plurality of wires 211 to the first face 205a of the IC chip 205. The method further comprises electrically conductively joining the first end 212a of each of the second plurality of wires 212 to the first face of one of the plurality of outer lead portions 828 and electrically conductively joining the second end 212b of each of the second plurality of wires 212 to the first face 205a of the IC chip 205.

Although the above exemplary embodiments of the present invention have been described, it will be understood by those skilled in the art that the present invention should not be limited to the described exemplary embodiments, but that various changes and modifications can be made within the spirit and scope of the present invention. Accordingly, the scope of the present invention is not limited to the described range of the following claims.

What is claimed is:

1. A method of assembling an integrated circuit package, comprising:
   a) providing:
      a leadframe having a first face and a second face opposite to said first face, wherein said leadframe comprises:
      an outer frame portion,
      a die pad portion substantially centrally disposed within said outer frame portion,
      a plurality of tie bars connecting said die pad portion to said outer frame portion, and
      a plurality of protuberances extending substantially radially inward from said outer frame portion, each of said plurality of protuberances comprising an inner lead portion, an outer lead portion, and a post portion connecting said inner lead portion from said outer lead portion,
      an integrated circuit chip having a first face and a second face opposite to said first face,
      a first plurality of wires each having a first end and a second end, and
      a second plurality of wires each having a first end and a second end;
   b) disposing an adhesive layer on said first face of said leadframe, whereby said adhesive layer covers said die pad portion, and part of said inner lead portion of each of said plurality of protuberances, wherein part of each of said inner lead portions remains free of adhesive;
   c) severing said outer lead portion from said inner lead portion by cutting said post portion;
   d) mounting said integrated circuit chip on said leadframe, whereby said second face of said integrated circuit chip is connected to a first face of said die pad portion through said adhesive layer, and whereby said second face of said integrated circuit is further connected to said inner lead portions through said adhesive layer;
   e) electrically conductively joining said first end of said first plurality of wires to a first face of one of said plurality of inner lead portions;
   f) electrically conductively joining said second end of each of said first plurality of wires to said first face of said integrated circuit chip;
   g) electrically conductively joining said first end of each of said second plurality of wires to a first face of one of said outer lead portions, and
   h) electrically conductively joining said second end of said second plurality of wires to said first face of said integrated circuit chip.

2. The method according to claim 1, wherein the adhesive layer disposed on said first face of said lead frame in step (b) covers only an outer edge of said die pad portion, and part of said inner lead portion of each of said plurality of protuberances, thereby leaving a central part of said die pad portion and a part of each of said inner lead portions remains free of adhesive.

* * * * *